(12) United States Patent
Nagarajan

(10) Patent No.: US 10,014,950 B2
(45) Date of Patent: *Jul. 3, 2018

(54) 56 GBPS PAM4 DRIVER MODULE FOR MACH ZEHNDER MODULATOR

(71) Applicant: INPHI CORPORATION, Santa Clara, CA (US)

(72) Inventor: Radhakrishnan L. Nagarajan, Santa Clara, CA (US)

(73) Assignee: INPHI CORPORATION, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/647,188

(22) Filed: Jul. 11, 2017

(65) Prior Publication Data
US 2017/0310400 A1 Oct. 26, 2017

Related U.S. Application Data

(63) Continuation of application No. 15/061,918, filed on Mar. 4, 2016, now Pat. No. 9,742,498.

(51) Int. Cl.
*H04B 10/50* (2013.01)
*H04B 10/516* (2013.01)

(52) U.S. Cl.
CPC .............................. *H04B 10/5161* (2013.01)

(58) Field of Classification Search
CPC ..... H04B 10/541; H04B 10/503; G02F 1/225; G02F 2001/212; G02F 1/0121; G02F 1/0123

USPC ......................................................... 398/186
See application file for complete search history.

(56) References Cited

U.S. PATENT DOCUMENTS

| 7,826,752 B1 * | 11/2010 | Zanoni ............... H04B 10/5055 398/186 |
| 9,742,498 B1 * | 8/2017 | Nagarajan .......... H04B 10/5161 |
| 2013/0308893 A1 * | 11/2013 | Zuffada ................... H03F 1/223 385/3 |
| 2016/0087727 A1 * | 3/2016 | Nagatani .............. H03G 3/3084 398/186 |
| 2016/0139485 A1 * | 5/2016 | Winzer ................. G02F 1/2255 385/3 |

* cited by examiner

*Primary Examiner* — Don N Vo
(74) *Attorney, Agent, or Firm* — Richard T. Ogawa; Ogawa P.C.

(57) ABSTRACT

A PAM4 driver with at least 56 Gbps speed for driving a Mach-Zehnder modulator. The PAM4 driver is configured as 2-bit CMOS digital-to-analog convertor including a drive control module for receiving a pair of incoming differential digital data and generating a first processed reference signal and a second processed reference signal. The PAM4 driver further includes a mirrored buffer circuit to produce two sets of four voltage levels. Furthermore, the PAM4 driver includes a decoder module controlled by a switch bias control module configured to decode each of the two sets of four voltage levels for generating a first output signal and a complementary second out signal with 4 independently adjustable analog levels for driving the Mach-Zehnder modulator with close ended termination resistor.

22 Claims, 5 Drawing Sheets

US 10,014,950 B2

56 GBPS PAM4 DRIVER MODULE FOR MACH ZEHNDER MODULATOR

CROSS-REFERENCE TO RELATED APPLICATIONS

This application is a continuation of and claims priority of U.S. patent application Ser. No. 15/061,918, filed Mar. 4, 2016, commonly assigned to Inphi Corporation, Santa Clara, Calif., incorporated by reference in its entirety herein for all purposes.

BACKGROUND OF THE INVENTION

The present invention relates to telecommunication techniques. More particularly, the present invention provides a 56 Gbps PAM4 driver for silicon photonics based Mach-Zehnder Modulator for high-rate optical data transmission, though other applications are possible.

Over the last few decades, the use of communication networks has exploded. In the early days Internet, popular applications were limited to emails, bulletin board, and mostly informational and text-based web page surfing, and the amount of data transferred was usually small. Today, Internet and mobile applications demand a huge amount of bandwidth for transferring photo, video, music, and other multimedia files. For example, a social networks like Facebook, process more than 500 TB of data daily. With such high demands on data transfer, existing data communication systems need to be improved to address these needs.

Progress in computer technology (and the continuation of Moore's Law) is becoming increasingly dependent on faster data transfer between and within microchips. Optical interconnects may provide a way forward, and silicon photonics may prove particularly useful, once integrated on the standard silicon chips. DWDM optical transmission over existing single-mode fiber with data-rates of 32-Gbit/s or higher is a target of the next generation of fiber-optic communication networks. Everything is okay up to 10 Gbits/s, but beyond that, distortion and dispersion take their toll. Many approaches are proposed on modulation methods for transmitting two or more bits per symbol so that higher communication rates can be achieved. Mach-Zehnder (MZ) modulators can handle the higher data rates but require a driver that is differential with a large output voltage swing, sufficiently high maximum oscillation frequency, and minimized parasitics. Therefore, improved driver design and implementations for 56 Gbps data-rate are desired.

BRIEF SUMMARY OF THE INVENTION

The present invention relates to telecommunication techniques. More particularly, the present invention provides a 56 Gbps PAM4 driver for silicon photonics based Mach-Zehnder Modulator for high-rate optical data transmission, though other applications are possible.

In modern electrical interconnect systems serial links have replaced parallel data buses, and serial link speed is rapidly increasing due to the evolution of CMOS technology. Internet bandwidth doubles almost every two years following Moore's Law. But Moore's Law is coming to an end in the next decade. Standard CMOS silicon transistors will stop scaling around 5 nm. And the internet bandwidth increasing due to process scaling will plateau. But Internet and mobile applications continuously demand a huge amount of bandwidth for transferring photo, video, music, and other multimedia files. This disclosure describes techniques and methods to improve the communication bandwidth beyond Moore's law.

Serial link performance is limited by the channel electrical bandwidth and the electronic components. 40G or 100G optical networking technology began deployment with client side using 40G VSR to interface with routers and line side using 40G or higher DWDM system to increase backbone network capacity with reach beyond 1000 km. The 40G or higher DWDM requires external Mach-Zehnder modulators and their drivers that have the best features coming out of a tradeoff between drive voltage and high bandwidth of the driver materials used. Differential driving technology disclosed in this application provides a preferred driver in small die form with wider output voltage swing, more flexible independent channel control, automatic tone generation, and better reliability for applications in transceivers that will reach the 40- and 100-Gbit/s targets.

In a specific embodiment, the present invention provides a driver configured by a 2-bit CMOS digital-to-analog convertor (DAC) for Mach-Zehnder modulator. The driver includes a drive control module configured to receive a pair of incoming differential digital data and to generate a first processed reference signal and a second processed reference signal.

Additionally, the driver includes a mirrored pair of buffer circuits configured to generate a first set of four voltage levels between ground and at least 2×CMOS system power supply voltage VDD level or higher in a first set of four output nodes and a second set of four complementary voltage levels between the 2×VDD level or higher and ground in a second set of four output nodes. Furthermore, the driver includes a decoder module configured to produce a first output signal based on the first set of four voltage levels respectively at the first set of four output nodes in association with the first processed reference signal and a second output signal based on the second set of four complementary voltage levels respectively at the second set of four output nodes in association with the second processed reference signal.

In an alternative embodiment, the present invention provides a method for driving a Mach-Zehnder modulator by a 56 Gbps PAM4 driver. The method includes forming a PAM4 driver chip with a power supply voltage of VDD. The PAM4 driver chip includes a drive control module configured with a pair of input ports for receiving a pair of incoming differential digital data to generate a first processed reference signal and a second processed reference signal. Additionally, the PAM4 driver chip includes a mirrored pair of buffer circuits including a pair of level-control modules configured to generate a complementary pair of four voltage levels from ground to 2×VDD. Furthermore, the PAM4 driver chip includes a decoder module controlled by a switch bias control module to produce a first output signal and a second output signal varied among the complementary pair of four voltage levels respectively in association with the first processed reference signal and the second processed reference signal. Moreover, the method includes flipping the PAM4 driver chip to have the pair of input ports being bonded via solder bumps with a pair of data ports of ASIC circuits and the first output port and the second output port being respectively bonded via solder bumps with corresponding input ports of a Mach-Zehnder modulator.

In general, the present invention provides a PAM4 driver capable of driving a Mach-Zehnder modulator in 56 Gbps or higher data-rate optical communication applications and beyond. The present invention achieves these benefits and others in the context of known optical technology. However, a further understanding of the nature and advantages of the present invention may be realized by reference to the latter portions of the specification and attached drawings.

BRIEF DESCRIPTION OF THE DRAWINGS

The following diagrams are merely examples, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

DETAILED DESCRIPTION OF THE INVENTION

Figure 1:
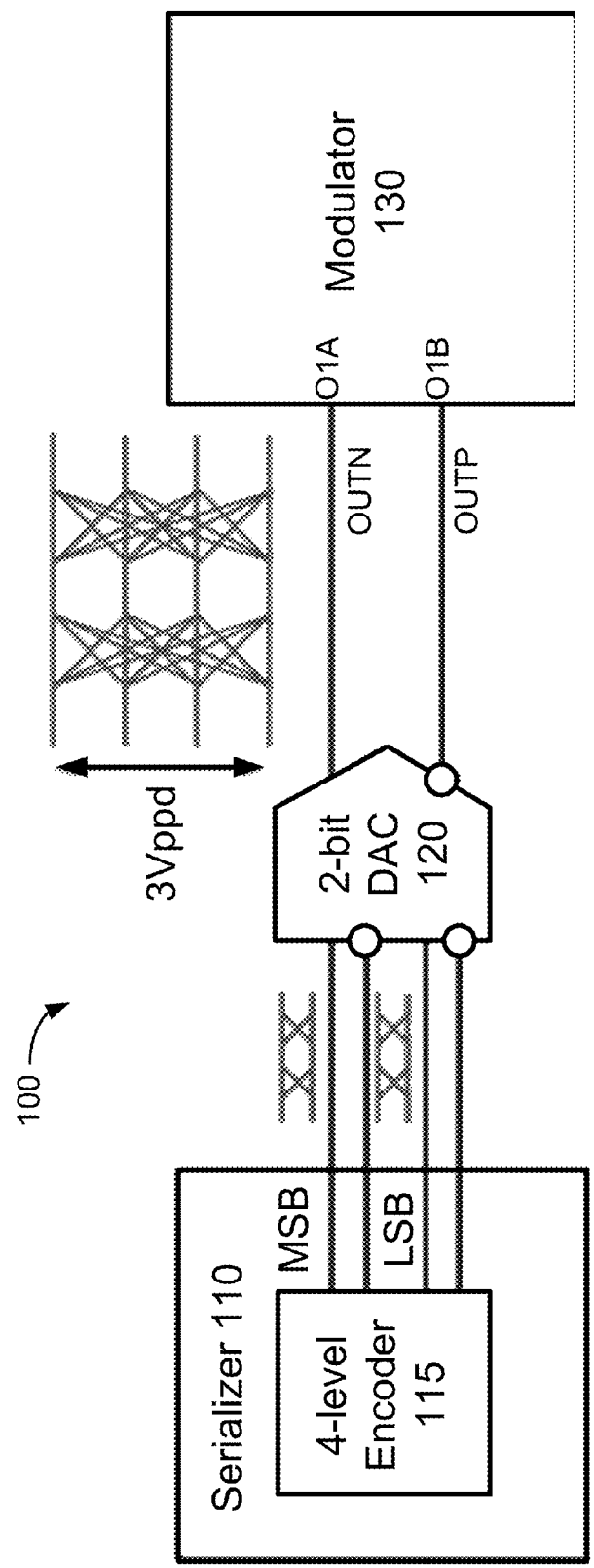
FIG. 1 is a simplified diagram of a 2-bit DAC based driver with PAM4 modulation implementation for driving a Mach-Zehnder modulator according to an embodiment of the present invention.

The present invention relates to telecommunication techniques. More particularly, the present invention provides a 56 Gbps PAM4 driver for silicon photonics based Mach-Zehnder Modulator for high-rate optical data transmission, though other applications are possible.

In the last decades, with advent of cloud computing and data center, the needs for network servers have evolved. For example, the multiple-level switch/router configuration that have been used for a long time is no longer adequate or suitable, as distributed applications require flatter network architectures, where server virtualization that allows servers to operate in parallel. For example, multiple servers can be used together to perform a requested task. For multiple servers to work in parallel, it is often imperative for them to be share large amount of information among themselves quickly, as opposed to having data going back forth through multiple layers of network architecture (e.g., network switches, etc.).

Leaf-spine type of network architecture is provided to better allow servers to work in parallel and move data quickly among servers, offering high bandwidth and low latencies. Typically, a leaf-spine network architecture uses a top-of-rack switch that can directly access into server nodes and links back to a set of non-blocking spine switches that have enough bandwidth to allow for clusters of servers to be linked to one another and share large amount of data.

In a typical leaf-spine network today, gigabits of data are shared among servers. In certain network architectures, network servers on the same level have certain peer links for data sharing. Unfortunately, the bandwidth for this type of set up is often inadequate. It is to be appreciated that embodiments of the present invention utilizes PAM (e.g., PAM4, PAM8, PAM12, PAM16, etc.) in leaf-spine architecture that allows large amount (up terabytes of data at the spine level) of data to be transferred via optical network.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

FIG. 1 is a simplified diagram of a 2-bit DAC based driver with PAM4 modulation implementation for driving a Mach-Zehnder modulator according to an embodiment of the present invention. This diagram is merely an example, which should not unduly limit the scope of the claims. One of ordinary skill in the art would recognize many variations, alternatives, and modifications. As shown, a PAM4 driver 100 is configured to receive digital inputs from a serializer 110 of a transmitter ASIC circuit (not explicitly shown). The digital inputs, for example, are streamed in and processed by a 4-level encoder 115 which converts two bits of digital signals in NRZ format with two symbols "1" and "0" (representing two voltage levels) into one bit MSB data stream and one bit LSB data stream with data rate up to 56 Gbps and beyond. Then the MSB data stream and the LSB data stream are fed into a 2-bit digital-to-analog converter (DAC) 120 which produces a pair of analog output signals OUTN and OUTP applied respectively to port O1A and O1B of the PAM4 driver circuit 100 for driving a MZ modulator 130. Each of the analog output signals has amplitude resolution of 8 bits to ensure low signal-to-noise ratio for handling at least the 4-level PAM4 modulation.

In a specific embodiment, each of the output signals OUTN and OUTP is able to produce a driving current in each waveguide arm of the MZ modulator 130 and generate a single-ended voltage swing, e.g., up to 1.5V. A Vbias voltage is internally generated (referenced to ground level) to avoid any loss of range of the single-ended voltage swing due to lack of headroom when it is referenced to a Vcc level of a nominal positive power supply. Combining both single-ended output swings (between Vcc–1.5V and Vcc), a differential output amplitude is yield with a peak-to-peak voltage of 3.0V for providing modulation in PAM4 format to the optical signal passing through the two waveguides. In an implementation, for using a termination resistor RL of 30Ω (a nominal value in a particular embodiment), the output current of the PAM4 driver 100 is high enough to produce the 3V output swing. The output stage is configured to control the driving current to be stabilized over temperature and operating voltage using an internal on-chip reference. The PAM4 driver 100 will be calibrated by the user to accommodate variations over process corners.

In an implementation of the PAM4 driver with 32 Gbps data rate or higher, a major effort is made on improving the eye quality by optimizing the parasitic behavior of the electrical connection between the driver circuit as a flip-chip and the MZ modulator. Conventional wire bond for connecting the High-impedance driver output to the modulator introduce fairly large inductance around the bonding regions. Even the shortest feasible wire-bond inductance introduces substantial degradation to the quality for transmission signals characterized by eye opening, rise/fall time, and jitter.

Figure 2:
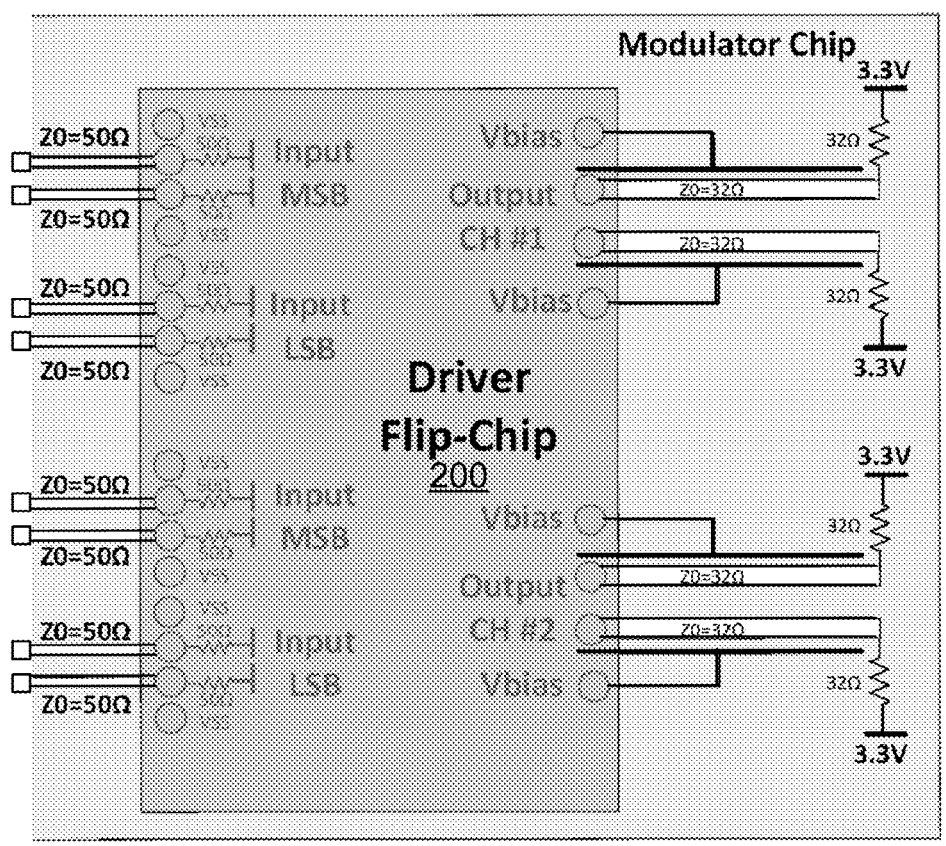
FIG. 2 is a schematic diagram showing solder bumped bonding of a driver flip-chip disposed on a modulator chip according to an embodiment of the present invention.

FIG. 2 is a schematic diagram showing solder bumped bonding of a driver flip-chip disposed on a modulator chip according to an embodiment of the present invention. This diagram is merely an example, which should not unduly limit the scope of the claims. One of ordinary skill in the art would recognize many variations, alternatives, and modifications. As shown, solder bumped bonding is provided for disposing a chip of a PAM4 driver 200 flipped on top of a modulator chip 230. The chip comprises a dual-channel PAM4 driver 200 having two Ch1 input ports respectively laid at an edge of the chip for receiving a first MSB bit and a first LSB bit and two similar Ch2 input ports respectively for receiving a second MSB bit and a second LSB bit. Each pair of MSB and LSB bits forms a differential pair signals per channel and correspondingly each channel produces a differential pair outputs with all I/O and control pins being laid as pads along edges of the chip. The input ports and associated grounding ports as well as all output ports mentioned above are flipped to face down and bond respectively with system inputs and modulator inputs set below fully by solder bumps to reduce parasitic inductance and improve signal transmission from the driver to the modulator. As shown, the modulator chip 230 is substantially a MZ modulator 130 schematically shown here with two equivalent waveguide arms with signal amplitude modulation driven by DC currents controlled by low power 3.3V voltage.

In an embodiment, the PAM4 driver 200 is implemented in association with the 2-bit DAC as described in FIG. 1 for driving the MZ modulator 130. In a specific embodiment, the dual-channel PAM4 driver 300 is laid out in a 2.55 mm×1.30 mm SiGe die pad as small as 2.55 mm×1.30 mm for achieving 56 Gbps speed and high oscillation frequency ($f_{max}$>350 GHz). For the SiGe based driver, sufficiently high $f_{max}$ is not the only requirement in order to achieve 56 Gbps speed at low power consumption. Narrow emitter stripe is also required, for example, <0.1 µm, to achieve current density corresponding to $f_{max}$ at low device current levels. Small transistor layout footprint is essential in order to minimize RC parasitics.

Figure 3:
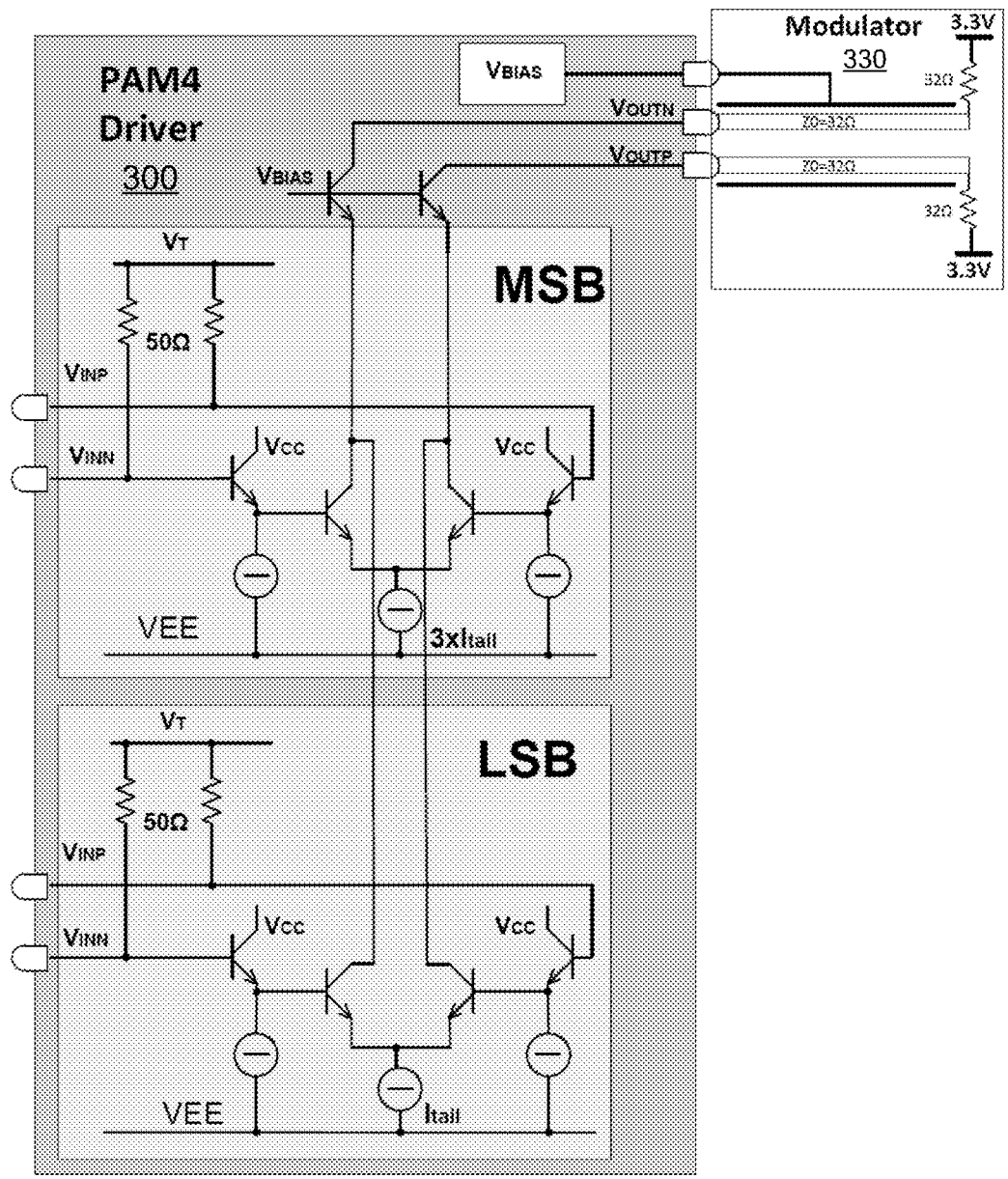
FIG. 3 is a simplified partial circuit diagram of one-channel 56 Gbps PAM4 modulator driver according to an embodiment of the present invention.

FIG. 3 is a simplified partial circuit diagram of one-channel 56 Gbps PAM4 modulator driver according to one implementation of the present invention. This diagram is merely an example, which should not unduly limit the scope of the claims. One of ordinary skill in the art would recognize many variations, alternatives, and modifications. As shown, the 56 Gbps PAM4 driver 300 is based on an implementation of using SiGe bipolar transistors. One channel of the PAM4 driver 300 is conceptually illustrated to receive two incoming differential pair input data signals. One includes a first differential pair $V_{INP}$ and $V_{INN}$ for the LSB bit and another one includes a second differential pair $V_{INP}$ and $V_{INN}$ for the MSB bit. Each of the differential digital LSB bit and MSB bit, after passing through a first-stage amplifier, are fed into a 2-bit digital-to-analog converter which converts the LSB bit to a lower level differential analog signal above a VEE level with 1× Itail current being applied and converts the MSB bit to a higher level differential analog signal above the VEE level with 3× Itail current being applied. Both low and high level differential analog signals are combined and amplified by a second-stage amplifier to generate one differential analog signal having four levels of power with peak-to-peak output swing of 3V in terms of either $V_{OUTN}$ or $V_{OUTP}$ of the corresponding channel for driving an impedance-matched Mach-Zehnder modulator 330. In this embodiment, each waveguide arm of the MZ modulator 330 has an independent termination resistor coupled to a Vcc=3.3V power supply. In an embodiment, the MZ modulator 330 is substantially the same as the modulator 130 of FIG. 1. In another embodiment, the MZ modulator 330 is substantially the same as modulator 230 of FIG. 2.

In an embodiment the second channel of the dual-channel PAM4 driver would be configured in substantially the same way as described above. On the one hand, it is expected that the PAM4 driver 300 to be consuming approximately 2× less power compared to a linear driver and to not require external bias inductors. On the other hand, the PAM4 driver 300 only has symmetric adjustability by either moving closer or further apart the in two inner levels or to move closer or further apart the two outer levels. In an example, the maximum single-ended swing is about 1.5V corresponding to a peak-to-peak output swing of 3V. The symmetric adjustment can be done by moving two outer levels to have a peak-to-peak output swing >3V.

Figure 4:
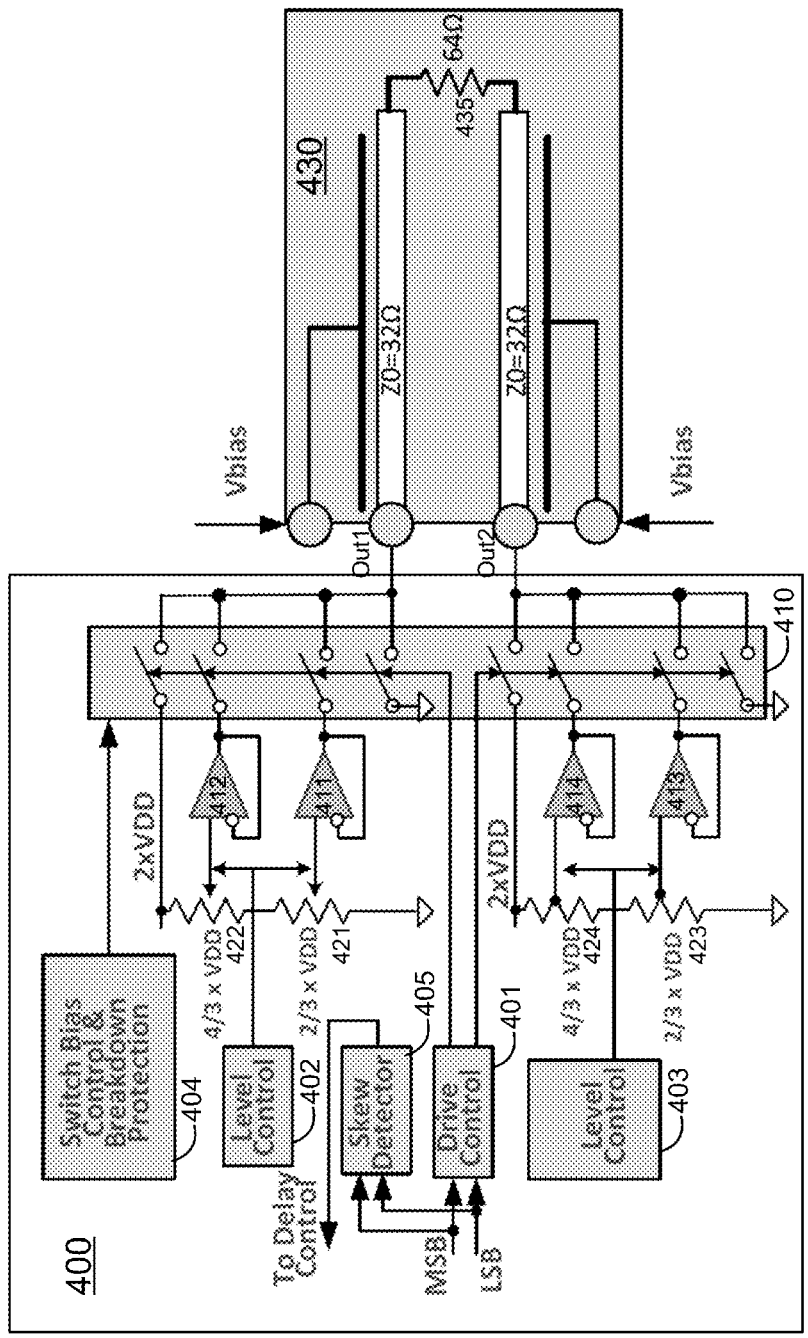
FIG. 4 is a simplified partial circuit diagram of one-channel 56 Gbps PAM4 modulator driver according to an alternative embodiment of the present invention.

FIG. 4 is a simplified partial circuit diagram of one-channel 56 Gbps PAM4 modulator driver according to an alternative embodiment of the present invention. This diagram is merely an example, which should not unduly limit the scope of the claims. One of ordinary skill in the art would recognize many variations, alternatives, and modifications. In this embodiment, the PAM4 driver 400 is implemented as a 2-bit digital-to-analog converter (DAC) based on CMOS technology with 28 nm, 16 nm or smaller node. As shown, the 2-bit DAC circuit includes a drive control module 401 with I2C interface is used to detect a coarse MSB bit and a fine LSB bit digital incoming data from ASIC circuits associated with communication system (not shown). The drive control module 401 is configured to process the differential levels of each incoming digital data to generate a pair of processed reference signals. Each of two processed reference signals is then sent to a 2-bit decoder module for producing 4 complementary analog voltage levels for each of two output drive signals, Out1 and Out2, between a ground (VSS) level and at least 2×VDD level for driving a MZ modulator 430. VDD is a system power supply voltage for the CMOS circuit. Typically, VDD can be 1.8V, or 3.3V, or as low as 0.9-1.2V.

In a specific embodiment, the 2-bit CMOS DAC circuit is implemented by a mirrored pair of buffer circuits configured to produce a first set of four voltage levels and a second set of four voltage levels that are complementary to the first set. Additionally, the 2-bit CMOS DAC circuit is configured to use a decoder module 410 to decode the first/second set of four voltage levels to generate a pair of differential voltage signals based on the first/second processed reference signal.

In an embodiment, the decoder module 410 includes a mirrored pair of 4-switch sets respectively coupled to a first set of four output nodes of a first buffer circuit and a second set of four output nodes of a second mirrored buffer circuit. The first buffer circuit includes a first pair of amplifiers 411 and 412. Each amplifier 411/412 has an input port being connected to an adjustable point dividing one of a pair of effective resistors to two variable fractions, the pair of effective resistors being connected in series with one end at the VSS level and another end at the 2×VDD level held by a CMOS circuitry. Additionally, the first buffer circuit includes a first level-control module 402 configured to programmably tune each adjusting point to change a ratio of the two variable fractions of each of the first pair of effective resistors 421/422 and operate the two amplifiers 411 and 412 to determine two middle levels of voltages between the VSS and 2×VDD level. In a specific embodiment, the two middle levels of voltages include a 2/3×VDD level and a 4/3×VDD level, as desired. Each of the two middle level voltages is set at corresponding two middle output nodes. With a first output node being set to ground and a fourth output node being held at 2×VDD, the four voltage levels are defined for the first set of four output nodes.

Similarly in a mirrored configuration, the second mirror buffer circuit includes a second level-control module 403 coupled to the second pair of amplifiers 413/414 with adjustable input points at a second pair of effective resistors 423/424 for setting two desired middle-level voltages at desired 2/3×VDD level and 4/3×VDD level. With a first output node being set to ground and a fourth output node being held at 2×VDD, another set of four voltage levels are defined for the second set of four output nodes.

In another embodiment, the decoder module 410 is configured with a mirrored pair of 4-switch sets commonly controlled by a switch bias control module 404. Each switch in each 4-swtich set is configured by one or more transistors formed in CMOS technology in voltage driven mode (although current drive mode is also an option) with switch speed at least greater than 56 Gbps. The mirrored pair of 4-switch sets are operated respectively for decoding the four voltage levels at the first set of four output nodes and the four voltage levels at the second set of four output nodes to generate a first output signal and a second output signal in a complementary manner in association with the first and second processed reference signals received from the drive module 401. In a specific embodiment, the first processed reference signal is a voltage signal received in series by a first, a second, a third, and a fourth switch in the first 4-switch set. The first switch is configured to pass the ground level at first output node. The second and third switches are configured to pass 2/3×VDD level and 4/3×VDD level. The fourth switch is set to pass 2×VDD level. In a complementary manner, the second processed reference signal is a voltage signal received in series by a first, a second, a third, and a fourth switch in the second 4-switch set. But, the first switch is configured to pass 2×VDD level, and the second, third, fourth switch are respectively configured to pass 4/3×VDD, 2/3×VDD, and VSS levels.

By programmably operating the switch bias control module 404, each switch in each of the mirrored pair of 4-switch sets can be controlled in its On/Off state to determine a specific level for the first output signal Out1 and a corresponding complementary level for the second output signal Out2. For example, the first output signal Out1 may be at VSS level and complementarily the second output signal Out2 is set to 2×VDD level. In general, the pair of first/second output signals are defined a differential voltage drive signals configured in four complementary pulse-amplitude-modulation (PAM4) levels for controlling a MZ modulator 430 with data transfer rate above 56 Gbps. The electrical coupling between each output port associated with either the first output signal Out1 and the second output signal Out2 of the driver chip and corresponding input port of the MZ modulator is achieved using flip solder bump bonding to reduce parasitic loss and minimize jitter.

The Out1 and Out2 complementary voltage drive signals are applied respectively to two waveguide arms of the MZ modulator 430 to provide amplitude-based modulation. Each waveguide arm of the modulator 430 is biased with a Vbias voltage. The two waveguide arms are closely looped via a termination resistor 435 so that the voltage swing of the modulator is ranged up to full 2×VDD while each of the four levels can be freely adjusted. This is contrary to the previous implementation of using SiGe die, where the each end of the two waveguide arms of the modulator (330) is connected via one termination resistor (having half of the resistance of termination resistor 435) to a 3.3V power source, with only symmetric adjustability for middle or outer two levels.

Figure 5:
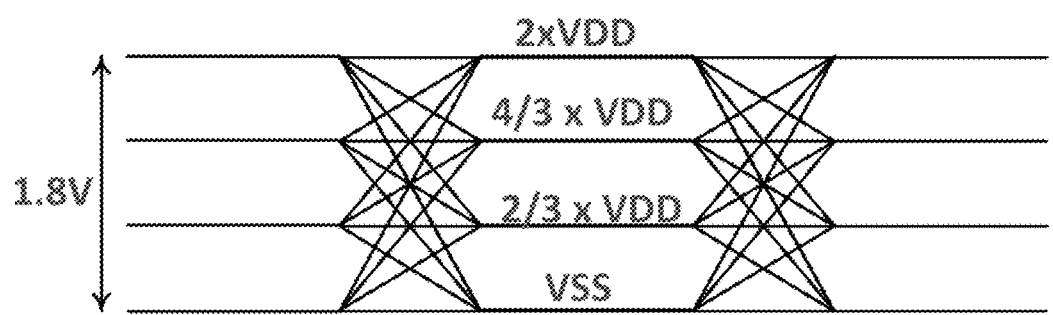
FIG. 5 is a simplified diagram illustrating a 4-level (PAM4) data eye according to one or more embodiments of the present invention.

FIG. 5 is a simplified diagram illustrating a 4-level (PAM4) data eye according to one or more embodiments of the present invention. This is an exemplary outcome of a 4-level (PAM4) data eye generated by the PAM4 driver 400 in the CMOS implementation described in FIG. 4. The 4 levels are ground level VSS, 2/3×VDD level, 4/3×VDD level, and 2×VDD level. As shown in the example, the VDD level is 0.9V. With one variable VDD, each level can be adjusted independently. The adjustment is achieved via two amplifiers 411/412 (or 413/414) controlled by corresponding level-control circuit 402 or 403 as well as the series of switch set 410. The adjustment is controlled by controlled by the Switch Bias Control circuit 404 with breakdown protection. Two output signals Out1 and Out2 with four analog levels are generated as driving signals for the modulator 430.

In an embodiment, the switches in the mirrored pair of 4-switch set 410 are made by CMOS transistors at 28 nm or smaller node which offers switching speed sufficient for 56 Gbps. However, the maximum source-drain voltage is about 0.9V based on usual thin oxide layer CMOS transistor, which is not enough to ensure that only part of the supply voltage is applied to the terminals of the CMOS transistor. Improved CMOS circuit implementation is required to achieving higher break-down voltage with BVceo>1.5V for implementing the modulator driver with 56 Gbps speed under a power supply voltage of VDD as low as 0.9V and an output swing of 1.8V for 28 nm or smaller node CMOS circuit.

Referring back to FIG. 4, in another embodiment, in order to detect delay difference between incoming LSB data and MSB data, a skew detector 405 is included in the PAM4 driver 400. The skew detector 405 is configured to detect and feedback the information of the delay difference to the ASIC which has ability to adjust the skew.

While the above specification is a full description of the specific embodiments, various modifications, alternative constructions and equivalents may be used. Therefore, the above description and illustrations should not be taken as limiting the scope of the present invention which is defined by the appended claims.

What is claimed is:

1. A driver configured by a 2-bit CMOS digital-to-analog convertor (DAC) for Mach-Zehnder modulator, the driver comprising:
a drive control module configured to receive a pair of incoming differential digital data and to generate a first processed reference signal and a second processed reference signal;
a mirrored pair of buffer circuits configured to generate a first set of four voltage levels in a first set of four output nodes and a second set of four complementary voltage levels in a second set of four output nodes;
a decoder module configured to produce a first output signal based on the first set of four voltage levels respectively at the first set of four output nodes in association with the first processed reference signal and a second output signal based on the second set of four complementary voltage levels respectively at the second set of four output nodes in association with the second processed reference signal.

2. The driver of claim 1 wherein the pair of incoming differential digital data are configured to be one most significant bit (MSB) and one least significant bit (LSB) with data rate of 56 Gbps or higher.

3. The driver of claim 2 further comprising a skew detector configured to receive pair of incoming differential digital data to detect delay difference between incoming LSB bit data and MSB bit data received from ASIC circuits and feedback to the ASIC circuits for adjusting skew of output data eye diagram.

4. The driver of claim 1 wherein the first output signal and the second output signal are configured as a differential pair signal with four complementary pulse-amplitude-modulation (PAM4) levels.

5. The driver of claim 4 wherein the four complementary pulse-amplitude-modulation (PAM4) levels comprise a low level down to ground VSS=0V, two middle levels, and a high level of 2 times a power-supply voltage VDD.

6. The driver of claim 5 wherein each of the mirrored pair of buffer circuits comprises a pair of amplifiers respectively having one input configured to divide one of a pair of effective resistors to two variable fractions, the pair of effective resistors being connected in series with one end at the low level of VSS and another end at the high level of 2×VDD.

7. The driver of claim 6 wherein each of the mirrored pair of buffer circuits further comprising a level-control module configured to set the two variable fractions for each effective resistor to define the two middle levels of 2/3×VDD and 4/3×VDD.

8. The driver of claim 7 wherein each of the PAM4 levels is adjustable independently.

9. The driver of claim 1 wherein the drive control module is configured to communicate with ASIC circuits via an I2C interface.

10. The driver of claim 1 wherein the mirrored pair of buffer circuits comprises multiple transistors based on CMOS technology with 28 nm or smaller node.

11. The driver of claim 1 wherein the decoder module comprises a first 4-switch set respectively for coupling the first set of four output nodes and a mirrored second 4-switch set respectively for coupling the second set of four output nodes, each switch of the 4-switch set comprising transistors based on CMOS technology with 28 nm or smaller node configured to perform on/off switching in speed of 56 Gbps or faster.

12. The driver of claim 11 further comprising a switch bias control module configured to control the first 4-switch set sequentially coupled to the first processed reference signal to provide the first output signal at an analog voltage level selected from the first set of four voltage levels respectively at the first set of four output nodes.

13. The driver of claim 12 wherein the switch bias control module is configured to control the second 4-switch set sequentially coupled to the second processed reference signal to provide the second output signal at an analog voltage level selected from the second set of four complementary voltage levels respectively at the second set of four output nodes.

14. The driver of claim 1 wherein the first output signal and the second output signal are complementary voltage signals configured to drive a Mach-Zehnder modulator with two waveguide arms having a common end termination resistor.

15. The driver of claim 1 wherein each of the first processed reference signal and a second processed reference signal is a voltage signal.

16. The driver of claim 1 further comprises a format of a single chip flipped to have at least each input port of the drive control module being bonded with a corresponding output port of the ASIC circuits via solder bumped bonding.

17. The driver of claim 16 wherein the single chip is configured to have at least each output port associated with the first output signal and the second output signal being bonded to a corresponding input port of the Mach-Zehnder modulator via solder bumped bonding.

18. A method for driving a Mach-Zehnder modulator by a 56 Gbps PAM4 driver, the method comprising:
providing a PAM4 driver chip, the PAM4 driver chip comprising:
a drive control module configured with a pair of input ports for receiving a pair of incoming differential digital data to generate a first processed reference signal and a second processed reference signal;
a mirrored pair of buffer circuits including a pair of level-control modules configured to generate a complementary pair of four voltage levels from ground to a high level;
a decoder module controlled by a switch bias control module to produce a first output signal and a second output signal varied among the complementary pair of four voltage levels respectively in association with the first processed reference signal and the second processed reference signal;
flipping the PAM4 driver chip to have the pair of input ports being bonded via solder bumps with a pair of data ports of ASIC circuits and the first output port and the second output port being respectively bonded via solder bumps with corresponding input ports of a Mach-Zehnder modulator.

19. The method of claim 18 wherein the pair of incoming differential digital data are configured to be one most significant bit (MSB) and one least significant bit (LSB).

20. The method of claim 18 wherein each of the pair of level-control modules is configured to adjust two middle voltage levels between the ground and the high level set to be 2 times a power-supply voltage VDD, the two middle levels of 2/3×VDD level and 4/3×VDD.

21. The method of claim 18 wherein the first output signal and the second output signal are complementary voltage signals configured to drive the Mach-Zehnder modulator with two waveguide arms sharing a common end termination resistor.

22. The method of claim 18 wherein the decoder module comprises a first 4-switch set respectively for coupling the first set of four output nodes and a mirrored second 4-switch set respectively for coupling the second set of four output nodes, each switch of the 4-switch set comprising transistors based on CMOS technology with 28 nm or smaller node configured to perform on/off switching in speed of 56 Gbps or faster.

* * * * *